(12) United States Patent
Choi et al.

(10) Patent No.: US 9,948,239 B2
(45) Date of Patent: Apr. 17, 2018

(54) CONFIGURABLE MIXER

(71) Applicant: QUALCOMM Incorporated, San Diego, CA (US)

(72) Inventors: Kiyong Choi, San Jose, CA (US); Yi Zeng, San Jose, CA (US); Hong Sun Kim, San Jose, CA (US); Sasha Vujcic, San Diego, CA (US); Chirag Dipak Patel, San Diego, CA (US); Aleksandar Miodrag Tasic, San Diego, CA (US); Timothy Donald Gathman, San Diego, CA (US); Wu-Hsin Chen, San Diego, CA (US); Klaas van Zalinge, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/272,124

(22) Filed: Sep. 21, 2016

(65) Prior Publication Data

US 2018/0083574 A1    Mar. 22, 2018

(51) Int. Cl.
*G06G 7/16* (2006.01)
*H03D 7/14* (2006.01)
(Continued)

(52) U.S. Cl.
CPC ........... *H03D 7/1458* (2013.01); *H03F 3/193* (2013.01); *H03F 3/21* (2013.01); *H03F 3/45179* (2013.01);
(Continued)

(58) Field of Classification Search
CPC .......... H03F 7/1458; H03F 3/21; H03F 3/193; H03F 2200/294; H03F 2203/45288; H03F 2200/451; H03D 7/1458; H03G 3/3036; H04W 52/0209
See application file for complete search history.

(56) References Cited

U.S. PATENT DOCUMENTS 6,194,955 B1    2/2001    Ishida
6,211,718 B1    4/2001    Souetinov
(Continued)

FOREIGN PATENT DOCUMENTS

| EP | 0961398 A1 | 12/1999 |
| JP | 2008160672 A | 7/2008 |
| WO | WO-2005011103 A1 | 2/2005 |

OTHER PUBLICATIONS

Gupta N., et al., "A 1.2V Wide-Band Reconfigurable Mixer for Wireless Application in 65nm CMOS Technology", 2015 28th IEEE International System-On-Chip Conference (SOCC), IEEE, Sep. 8, 2015, pp. 49-52, XP032863836, DOI: 10.1109/SOCC.2015.7406908 [retrieved on Feb. 12, 2016].
(Continued)

*Primary Examiner* — Kenneth B Wells
(74) *Attorney, Agent, or Firm* — Paradice and Li LLP/Qualcomm

(57) ABSTRACT

A method and apparatus are disclosed for a configurable mixer capable of operating in a linear, a legacy, and a low-power mode. In the linear mode, the configurable mixer is configured to operate as a double-balanced mixer to multiply a first differential signal by a second differential signal. In the legacy mode, the configurable mixer is configured to as a double-balanced mixer to multiply a differential signal by a single-ended signal. In the low-power mode, the configurable mixer is configured to operate as a single-balanced mixer to multiply a differential signal by a single-ended signal. The operating mode of the configurable mixer may be based, at least in part, on a mode control signal. In some embodiments, the configurable mixer may be included in an analog front end of a wireless communication device.

26 Claims, 11 Drawing Sheets

(51) Int. Cl.
    *H03F 3/193*     (2006.01)
    *H03F 3/21*     (2006.01)
    *H03F 3/45*     (2006.01)
    *H03G 3/30*     (2006.01)
    *H04W 52/02*     (2009.01)

(52) U.S. Cl.
    CPC ..... *H03G 3/3036* (2013.01); *H03F 2200/294* (2013.01); *H03F 2200/451* (2013.01); *H03F 2203/45288* (2013.01); *H04W 52/0209* (2013.01)

(56) References Cited

U.S. PATENT DOCUMENTS

| | | | |
|---|---|---|---|
| 7,587,224 | B2 | 9/2009 | Zolfaghari |
| 7,890,069 | B2 * | 2/2011 | Kyranas ............... H03C 5/00 455/141 |
| 8,072,242 | B2 | 12/2011 | Barbier |
| 8,577,322 | B1 | 11/2013 | Jin et al. |
| 8,963,610 | B2 | 2/2015 | Mishra et al. |
| 2010/0171542 | A1 | 7/2010 | Dawe et al. |
| 2011/0281541 | A1 | 11/2011 | Borremans |
| 2016/0049913 | A1 | 2/2016 | Jussila et al. |

OTHER PUBLICATIONS

International Search Report and Written Opinion—PCT/US2017/046801—ISA/EPO—dated Nov. 20, 2017.
Niknejad, Ali M., "Lecture 20: Passive Mixers", 2005, University of California Berkeley, EECS 142 Lecture 20, Integrated Circuits for Communication, pp. 1-32.

* cited by examiner

CONFIGURABLE MIXER

TECHNICAL FIELD

The example embodiments relate generally to communication devices, and specifically to configurable mixers.

BACKGROUND OF RELATED ART

Communication devices may transmit and receive communication signals via a communication medium. In one example, the communication medium may be a wireless medium in which communication signals are transmitted and received according to a wireless communication protocol. Example wireless communication protocols may include IEEE 802.11 protocols and Bluetooth protocols according to the Bluetooth Special Interest Group. In another example, the communication medium may be a wired medium in which communication signals are transmitted and received according to a wire-based communication protocol. Some example wire-based protocols may include an Ethernet® protocol and/or a Powerline Communications protocol described by the HomePlug 2.0 specification. In yet another example, the communication medium may be a hybrid combination of wired and wireless communication mediums.

Analog signals within communication devices may undergo a "mixing" operation to, for example, modulate a baseband signal for transmission, and/or demodulate a received signal to recover the baseband signal. For example, a communication device may include a mixer to "mix" (e.g., multiply) a baseband signal together with a local oscillator (LO) signal to generate a radio frequency (RF) signal for amplification and transmission by the communication device.

When a communication device, such as a wireless communication device, operates in the presence of signal jammers or other interferers, the received signal may not be correctly demodulated by the mixer. For example, if the mixing operation is not relatively linear, then all or part of the signal jammer or other interferer may be included in, or otherwise affect the demodulated signal. However, a mixer with relatively high linearity may consume more power than other mixers (e.g., mixers with lower linearity), and therefore may not be desirable for use in mobile (e.g., battery powered) devices.

Thus, there is a need to control operations of communication devices to reduce power consumption and improve signal processing performance, especially in the presence of jammers or other signal interferers.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A configurable mixer and method of operation are disclosed that may provide a configurable amount of linearity and/or provide a reduction in power consumption based, at least in part, on an operating mode.

In one example, the configurable mixer may include a first transistor pair to multiply a first signal by a first differential signal, a second transistor pair to multiply a second signal by the first differential signal, and a first set of switches to selectively couple respective gate terminals of the second transistor pair to a ground potential, based, at least in part, on an operating mode of the configurable mixer.

In another example, an analog front end is disclosed. The analog front end may include a low noise amplifier, a transconductance amplifier to receive a low noise amplifier output signal, and a configurable mixer. The configurable mixer may include a first transistor pair to multiply a first signal by a first differential signal, a second transistor pair to multiply a second signal by the first differential signal, and a first set of switches to selectively couple respective gate terminals of the second transistor pair to a ground potential, based, at least in part, on an operating mode of the configurable mixer In another example, a method of operating an analog front end comprising a configurable mixer is disclosed. The method may include selecting an operating mode of the analog front end, multiplying, by a first transistor pair, a first signal by a first differential signal, and selectively activating a first set of switches coupled to gate terminals of the second transistor pair based, at least in part, on the selected operating mode.

In another example, a configurable mixer is disclosed. The configurable mixer may comprise a means for multiplying a first signal by a first differential signal via a first transistor pair, and a means for multiplying a second signal by the first differential signal via a second transistor pair, where the means for multiplying the second signal is to selectively activate a first set of switches to couple gate terminals of the second transistor pair to a ground potential based, at least in part, on an operating mode of the configurable mixer.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

The example embodiments are described below in the context of Wi-Fi enabled devices for simplicity only. It is to be understood that the example embodiments are equally applicable for devices using signals of other various wireless standards or protocols. As used herein, the terms "wireless local area network (WLAN)" and "Wi-Fi" can include communications governed by the IEEE 802.11 standards, BLUETOOTH®, HiperLAN (a set of wireless standards, comparable to the IEEE 802.11 standards, used primarily in Europe), and other technologies used in wireless communications (e.g., ZigBee and WiGig).

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
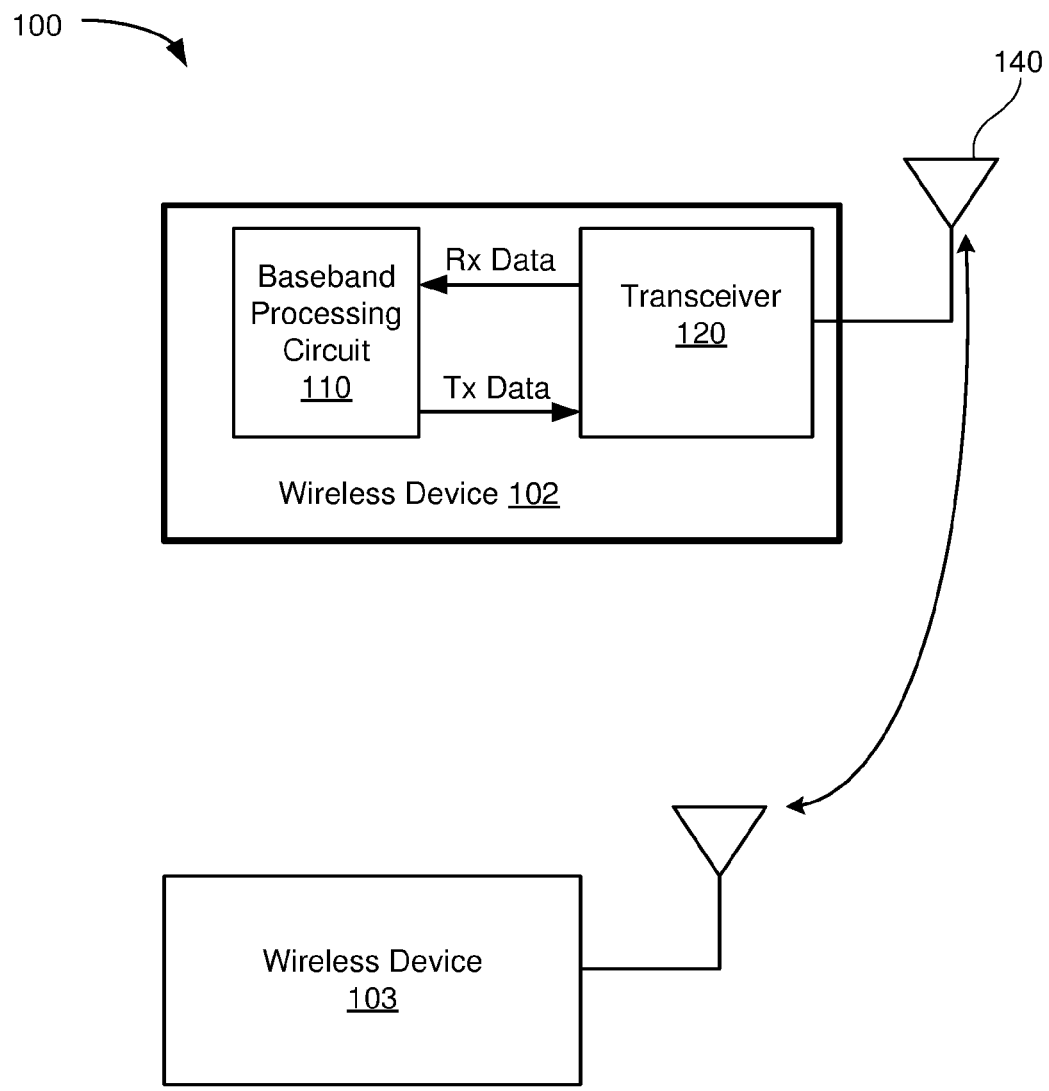
FIG. 1 shows an example communication system within which example embodiments may be implemented.

FIG. 1 shows an example communication system 100 within which example embodiments may be implemented. The communication system 100 may include wireless devices 102 and 103. Although only two wireless devices 102 and 103 are shown in FIG. 1 for simplicity, it is to be understood that the communication system 100 may include any number of wireless devices. The wireless devices 102 and 103 may be any suitable wireless enabled device including, for example, a cell phone, laptop, tablet computer, wireless access point, or the like. Each of the wireless devices 102 and 103 may also be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. For at least some embodiments, each of the wireless devices 102 and 103 may include one or more transceivers, one or more processing resources (e.g., processors and/or ASICs), one or more memory resources, and a power source (e.g., a battery). The memory resources may include a non-transitory computer-readable medium (e.g., one or more nonvolatile memory elements, such as EPROM, EEPROM, Flash memory, a hard drive, etc.) that stores instructions for performing operations described below with respect to FIG. 9.

The one or more transceivers may include Wi-Fi transceivers, Bluetooth transceivers, cellular transceivers, and/or other suitable radio frequency (RF) transceivers (not shown for simplicity) to transmit and receive wireless communication signals. Each transceiver may communicate with other wireless devices within distinct operating frequency bands and/or using distinct communication protocols. For example, the Wi-Fi transceiver may communicate within a 2.4 GHz frequency band and/or within a 5 GHz frequency band in accordance with the IEEE 802.11 specification. The cellular transceiver may communicate within various RF frequency bands in accordance with a 4G Long Term Evolution (LTE) protocol described by the 3rd Generation Partnership Project (3GPP) (e.g., between approximately 700 MHz and approximately 3.9 GHz) and/or in accordance with other cellular protocols (e.g., a Global System for Mobile (GSM) communications protocol). In other embodiments, the transceivers included within wireless devices 102 and 103 may be any technically feasible transceiver such as a ZigBee transceiver described by a specification from the ZigBee Alliance, a WiGig transceiver, and/or a HomePlug transceiver described by a specification from the HomePlug Alliance.

The wireless device 102 may include a transceiver 120, a baseband processing circuit 110, and an antenna 140. The baseband processing circuit 110 may be coupled to the transceiver 120 and may provide a baseband signal (e.g., transmit (TX) data) to the transceiver 120 for transmission through the communication medium. The baseband processing circuit 110 may also receive a baseband signal (e.g., receive (RX) data) from the transceiver 120. In some embodiments, the transceiver 120 may include a power amplifier to amplify communication signals for transmission via the antenna 140. The transceiver 120 may also include a low noise amplifier to receive transmitted signals from other wireless devices. The power amplifier and the low noise amplifier are not shown in FIG. 1 for simplicity.

Wireless device 103 may be similar to wireless device 102. For example, wireless device 103 may also include a controller and a transceiver not shown in FIG. 1 for simplicity.

In some embodiments, the transceiver 120 may include an analog front end to receive, amplify, and/or demodulate a received communication signal. The analog front end is described in more detail below in conjunction with FIG. 2.

Figure 2:
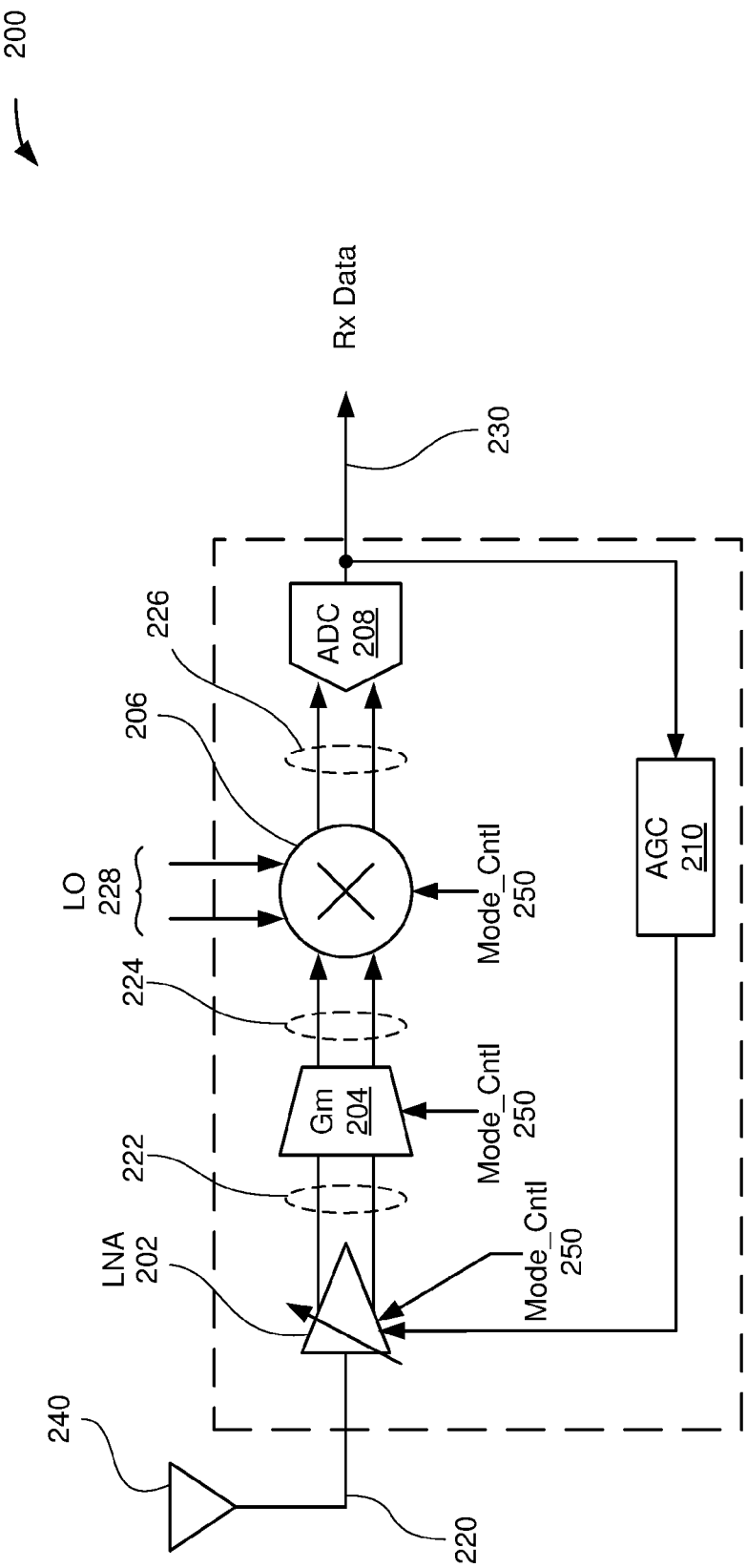
FIG. 2 depicts an analog front end, in accordance with some embodiments.

FIG. 2 depicts an analog front end 200, in accordance with some embodiments. For example, the analog front end 200 may be included within the transceiver 120 of FIG. 1. The analog front end 200 may include a low noise amplifier (LNA) 202, a transconductance (gm) amplifier 204, a configurable mixer 206, an analog-to-digital converter (ADC) 208, an automatic gain controller (AGC) 210, and an antenna 240. The antenna 240 may be an embodiment of the antenna 140 of FIG. 1. The antenna 240 may be coupled to the LNA 202. The LNA 202 may amplify a single-ended RF signal 220 received by the antenna 240 and may generate an LNA output signal 222. In some embodiments, the LNA 202 may also convert the RF signal 220 to a differential signal. Those skilled in the art will appreciate that a differential signal may include a first signal carried by a first conductor and a second signal carried by a second conductor that may form a complementary signal pair. Thus, the differential signal may be encoded as a voltage difference between the first conductor and the second conductor.

The LNA 202 may be coupled to the gm amplifier 204. In some embodiments, the gm amplifier 204 may amplify the LNA output signal 222 and may generate a single-ended or a differential gm amplifier output signal 224. The gm amplifier 204 may also convert voltage signals to current signals. For example, the gm amplifier 204 may have an associated transconductance value which may be a ratio of a change in current with respect to a change in voltage. Thus, an output current signal from the gm amplifier 204 may be based, at least in part, on an input voltage signal multiplied by the transconductance value.

The gm amplifier 204 may be coupled to the configurable mixer 206. The configurable mixer 206 may "multiply" two signals together to generate a mixer output signal 226. For example, the configurable mixer 206 may multiply a differential local oscillator (LO) signal 228 with the gm amplifier output signal 224 to generate the mixer output signal 226. Persons skilled in the art will appreciate that the mixer output signal 226 may include a first signal having a frequency equal to the frequency of LO signal 228 plus the frequency of gm amplifier output signal 224, and a second signal having the frequency of the gm amplifier output signal 224 minus the frequency of LO signal 228. In at least one embodiment, the mixer output signal 226 may be a differential signal.

The configurable mixer 206 may be coupled to the ADC 208. The ADC 208 may convert an analog mixer output signal 226 to a digital ADC output signal 230. In some embodiments, the ADC output signal 230 may be provided to the baseband processing circuit 110 of FIG. 1 (not shown for simplicity). For example, the ADC output signal 230 may be output as Rx data (e.g., as shown above in FIG. 1). The AGC 210 may be coupled to the ADC 208 and the LNA 202. The AGC 210 may adjust a gain of the LNA 202 based, at least in part, on the ADC output signal 230.

In some embodiments, the configurable mixer 206 may be configured to operate in a linear operating mode (e.g., as a double-balanced mixer mixing together two differential signals), in a legacy operating mode (e.g., as a double-balanced mixer mixing together a single-ended signal and a differential signal), or in a low-power operating mode (e.g., as a single-balanced mixer mixing together a single ended signal and a differential signal). In the linear operating mode, the configurable mixer 206 may receive and multiply a differential gm amplifier output signal 224 by the differential LO signal 228 to generate the differential mixer output signal 226. In the legacy operating mode, the configurable mixer 206 may receive and multiply a single-ended gm amplifier output signal 224 by a differential LO signal 228 to generate the differential mixer output signal 226. In the low-power operating mode, the configurable mixer 206 may receive and multiply a single-ended gm amplifier output signal 224 by a differential LO signal 228 to generate the differential mixer output signal 226.

The configurable mixer 206 may operate with more linearity when operating linear operating mode than when operating in either the legacy or low-power operating modes. The increased linearity may be due, at least in part, to more a more accurate mixing operation afforded by multiplying two differential signals together (e.g., compared to multiplying a single-ended signal by a differential signal). In addition, one or more components in the analog front end 200 may be configured to process and/or provide differential signals to the configurable mixer 206 when operating in the double-balanced operating mode.

The configurable mixer 206 may operate with relatively less linearity when operating in the legacy operating mode than when operating in the linear operating mode. In addition, in some embodiments, relatively less gain may be provided through the LNA 202/gm amplifier 204/configurable mixer 206 processing chain when operating in the legacy operating mode compared to when operating in the linear operating mode.

The configurable mixer 206 may consume relatively less power when operating in the low-power operating mode than when operating in either the linear or legacy operating modes. The power savings may be due, at least in part, to fewer components operating within the configurable mixer 206 to support the low-power operating mode. In addition, one or more components in the analog front end 200 may be configured to process and/or provide single-ended signals to the configurable mixer 206 when operating in the low-power operating mode.

In some embodiments, the operating mode of the configurable mixer 206 and/or components in the analog front end 200 may be controlled by a mode_cntl (e.g., mode control) signal 250. For example, the mode_cntl signal 250 may be provided to the LNA 202, the gm amplifier 204, and the configurable mixer 206. In other embodiments, a separate control signal may be provided to each of the components in the analog front end 200 and the configurable mixer 206 (not shown for simplicity). The mode_cntl signal may determine whether the LNA 202 and/or the gm amplifier 204 generates single-ended or differential output signals. In addition, the mode_cntl signal may determine whether the configurable mixer 206 operates in the linear, legacy, or low-power operating mode. The mode_cntl signal may be a multi-bit signal encoding operating modes of the configurable mixer 206 as well as controlling the LNA 202 and the gm amplifier 204.

In some embodiments, the analog front end 200 may be configured to process in-phase and quadrature signals. Thus, the LNA 202, the gm amplifier 204, the configurable mixer 206, the ADC 208, and/or the AGC 210 may include signal processing capabilities, components, and/or pathways to process in-phase and quadrature signals. For example, the configurable mixer 206 may include a first mixer for in-phase signals and a second mixer for quadrature signals (not shown for simplicity). In a similar manner, the LO signal 228 may include an in-phase LO signal and a quadrature LO signal (not shown for simplicity).

Figure 3A:
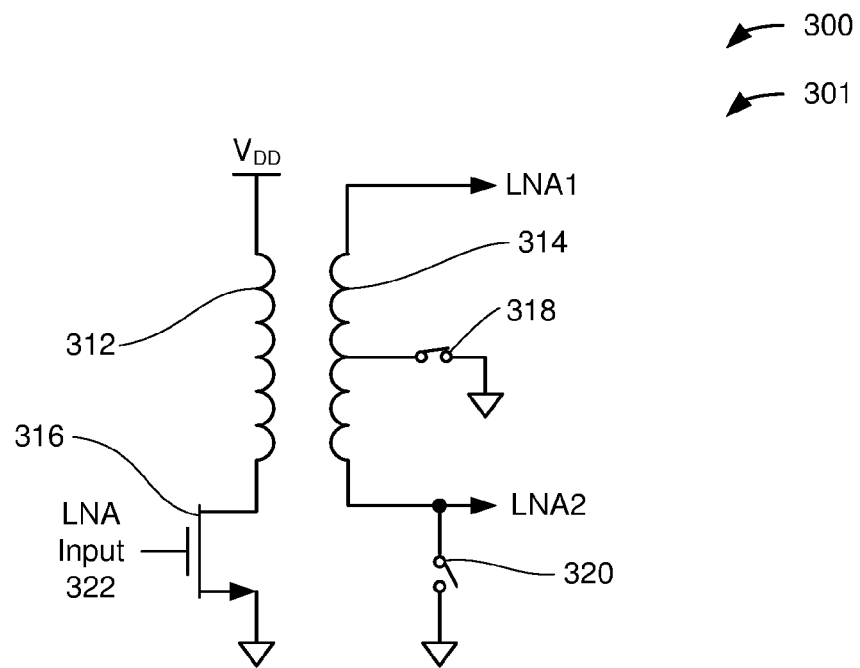
FIG. 3A is a schematic drawing of a first embodiment a low noise amplifier configured to operate in a differential mode.

FIG. 3A is a schematic drawing 301 of an LNA 300 configured to operate in a differential mode. The LNA 300 may be an embodiment of the LNA 202 of FIG. 2. The LNA 300 may include a first inductive element 312, a second inductive element 314, a transistor 316, a first switch 318, and a second switch 320. In the example of FIG. 3A, the first switch 318 is closed and the second switch 320 is open to operate the LNA 300 in the differential mode. In some embodiments, the first switch 318 and the second switch 320 may be controlled by a mode_cntl signal (not shown for simplicity). When closed, the first switch 318 may couple a center tap of the second inductive element 314 to a reference potential, which may include ground.

An LNA input signal 322, such as the RF signal 220 of FIG. 2, may be received by a gate terminal of the transistor 316. In response to the LNA input signal 322, the transistor 316 may drive (e.g., source or sink) a current through the first inductive element 312. The first inductive element 312 may generate a magnetic field based on the driven current. The magnetic field may be inductively coupled to the second inductive element 314, for example by inducing a corresponding current to flow in the second inductive element 314. When operating in the differential mode, the second inductive element 314 may have a first terminal LNA1 and a second terminal LNA2. Thus, the LNA 300 may generate a differential LNA output signal in the second inductive element 314 that is output through the first terminal LNA1 and the second terminal LNA2.

Although shown as mechanical switches, the first switch 318 and the second switch 320 may be any technically feasible device and/or electronic component suitable for electrically coupling together two or more terminals. For example, a switch may be a single-pole single throw (SPST) mechanical switch, a relay, a transistor, or other such device.

Figure 3B:
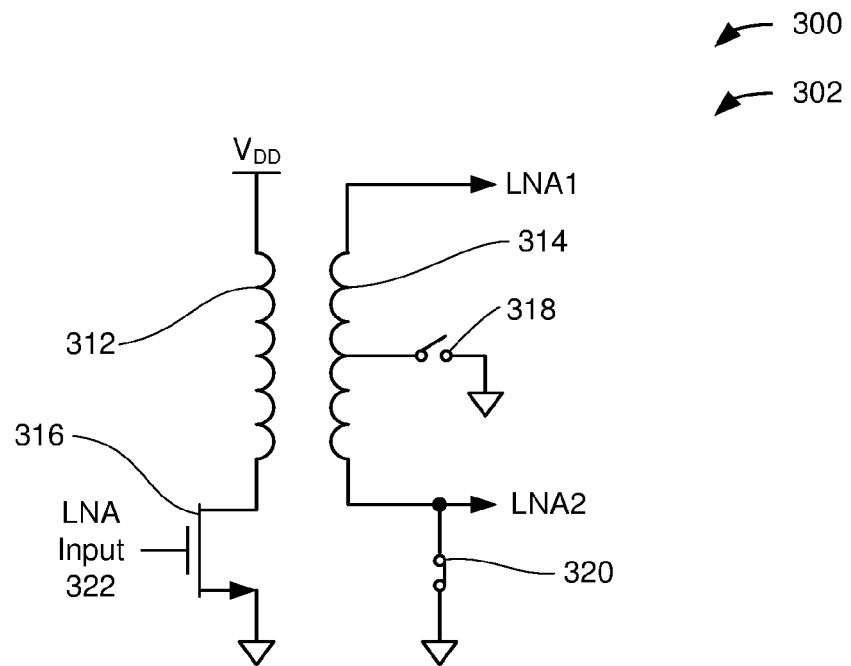
FIG. 3B is a schematic drawing of the low noise amplifier of FIG. 3A configured to operate in a single-ended mode.

FIG. 3B is a schematic drawing 302 of the LNA 300 configured to operate in a single-ended mode. In the example of FIG. 3B, the first switch 318 is open and the second switch 320 is closed to operate the LNA 300 in the single-ended mode. When the second switch 320 is closed, the second output terminal LNA2 is coupled to a reference potential, which may include ground.

As described above with respect to FIG. 3A, the LNA input signal 322 causes the transistor 316 to drive a current through the first inductive element 312. The first inductive element 312 may generate a magnetic field that may induce a corresponding current in the second inductive element 314. Note that the second terminal LNA2 is grounded to configure the second inductive element 314 to output single-ended signals. Thus, the LNA 300 may generate a single-ended LNA output signal in the second inductive element 314 that is output through the first terminal LNA1. Table 1 describes one embodiment of switch configurations to support the differential and the single-ended modes of the LNA 300

TABLE 1

| Switch | Differential Mode | Single-ended Mode |
| --- | --- | --- |
| 318 | Closed | Open |
| 320 | Open | Closed |

Figure 4A:
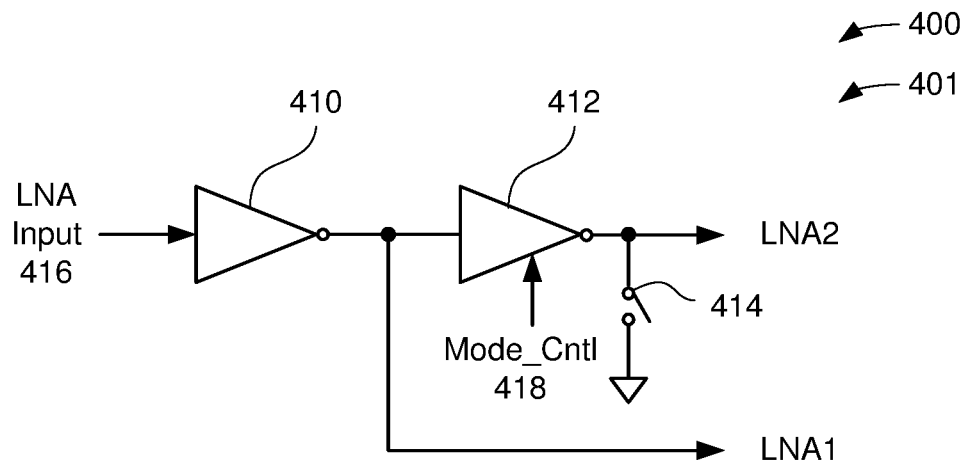
FIG. 4A is a schematic drawing of a second embodiment of a low noise amplifier configured to operate in a differential mode.

FIG. 4A is a schematic drawing 401 of an LNA 400 configured to operate in a differential mode. The LNA 400 may be another embodiment of the LNA 202 of FIG. 2. The LNA 400 may include a first inverting amplifier 410, a second inverting amplifier 412, and a switch 414. In some embodiments, the second inverting amplifier 412 may be enabled (e.g., powered on) and the switch 414 may be open when operating the LNA 400 in the differential mode. The LNA input signal 416 may be received by the first inverting amplifier 410. The first inverting amplifier 410 may amplify and invert the LNA input signal 416. The second inverting amplifier 412 may be coupled to the first inverting amplifier 410. In some embodiments, the second inverting amplifier 412 may be a unity gain inverting amplifier. An output of the first inverting amplifier 410 may be coupled to the first terminal LNA1 and an output of the second inverting amplifier 412 may be coupled to the second terminal LNA2. In some embodiments, the second inverting amplifier 412 and the switch 414 may be controlled by the mode_cntl signal 418. Although shown as mechanical switches, the switch 414 may be any technically feasible device and/or electronic component suitable for electrically coupling together two or more terminals.

When operating in the differential mode, the first inverting amplifier 410 may receive, amplify, and invert the LNA input signal 416. The second inverting amplifier 412 may invert and amplify (with unity gain) the output of the first inverting amplifier 410. Accordingly, the LNA 400 may generate a differential LNA output signal across the first terminal LNA1 and the second terminal LNA2.

Figure 4B:
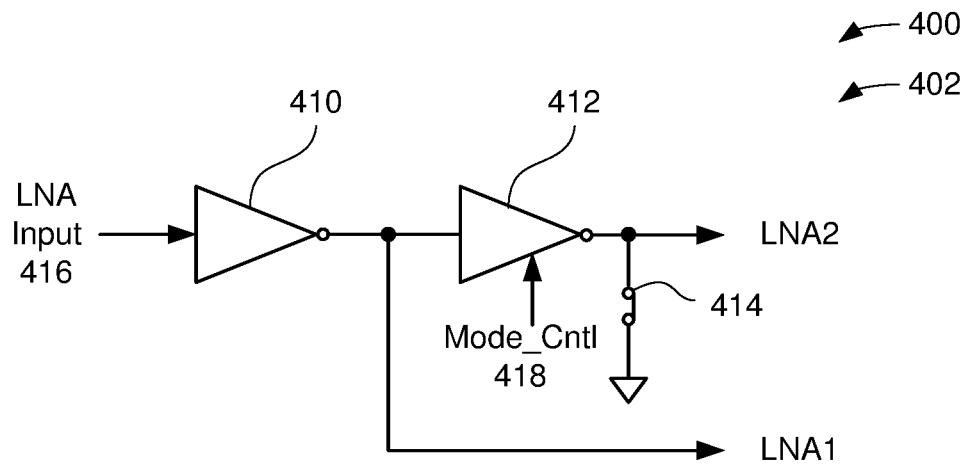
FIG. 4B is a schematic drawing of the low noise amplifier of FIG. 4A configured to operate in a single-ended mode.

FIG. 4B is a schematic drawing 402 of the LNA 400 configured to operate in a single-ended mode. When operating in the single-ended mode, the switch 414 may be closed, and may couple the second terminal LNA2 to a reference potential, which may include ground. Additionally, the second inverting amplifier 412 may be disabled and/or placed in a low-power state when operating the LNA 400 in the single-ended mode.

When operating in the single-ended mode, the first inverting amplifier 410 may receive, amplify, and invert the LNA input signal 416. Thus, the LNA 400 may generate the single-ended LNA output signal through the first terminal LNA1 (e.g., since the second terminal LNA2 is coupled to ground). Additionally, the LNA 400 may consume less power when operating in the single-ended mode because the second inverting amplifier 412 may be disabled or placed in a low-power state. Table illustrates various states of the switch 414 and the second inverting amplifier 412 when operating the LNA 400 in the differential and the single-ended modes. Although only two LNA embodiments are described above, persons skilled in the art will recognize that other LNA implementations are possible.

TABLE 2

| Component | Differential Mode | Single-ended Mode |
| --- | --- | --- |
| Switch 414 | Open | Closed |
| Second Inverting Amplifier 412 | Enabled | Disabled |

Figure 5A:
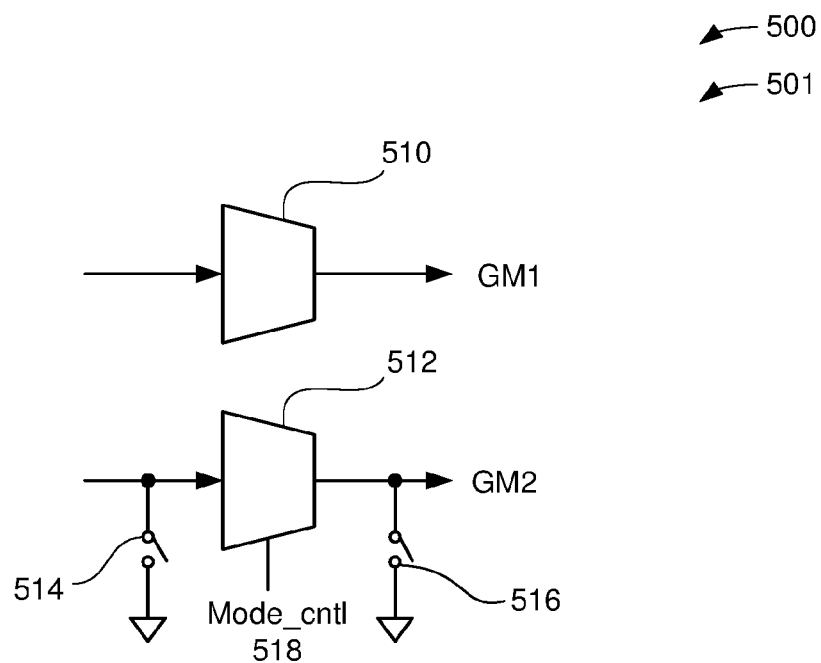
FIG. 5A is a block diagram of a transconductance amplifier configured to operate in a differential mode.

FIG. 5A is a block diagram 501 of a gm amplifier 500 configured to operate in a differential mode. As described above with respect to FIG. 2, a gm amplifier may receive a voltage signal and convert the voltage signal to a current signal. The gm amplifier 500 may include a first gm unit 510, a second gm unit 512, a first switch 514, and a second switch 516. In some embodiments, the second gm unit 512 may be enabled, and the first switch 514 and the second switch 516 are open when operating the gm amplifier 500 in the differential mode. When configured to operate in the differential mode, the first gm unit 510 and the second gm unit 512 may be configured to receive a differential gm input signal, such as a differential LNA output signal (not shown for simplicity). For example, the first gm unit 510 may receive a first gm input signal (from the LNA output signal 222 shown in FIG. 2) and output a first gm output signal through a first terminal GM1. The second gm unit 512 may receive a second gm input signal and output a second gm output signal through a second terminal GM2. Thus, the gm amplifier 500 may generate a differential gm output signal across the first terminal GM1 and the second terminal GM2. In some embodiments, the second gm unit 512, the first switch 514, and the second switch 516 may be controlled by the mode_cntl signal 518. Although shown as mechanical switches, the first switch 514 and the second switch 516 may be any technically feasible device and/or electronic component suitable for electrically coupling together two or more terminals.

Figure 5B:
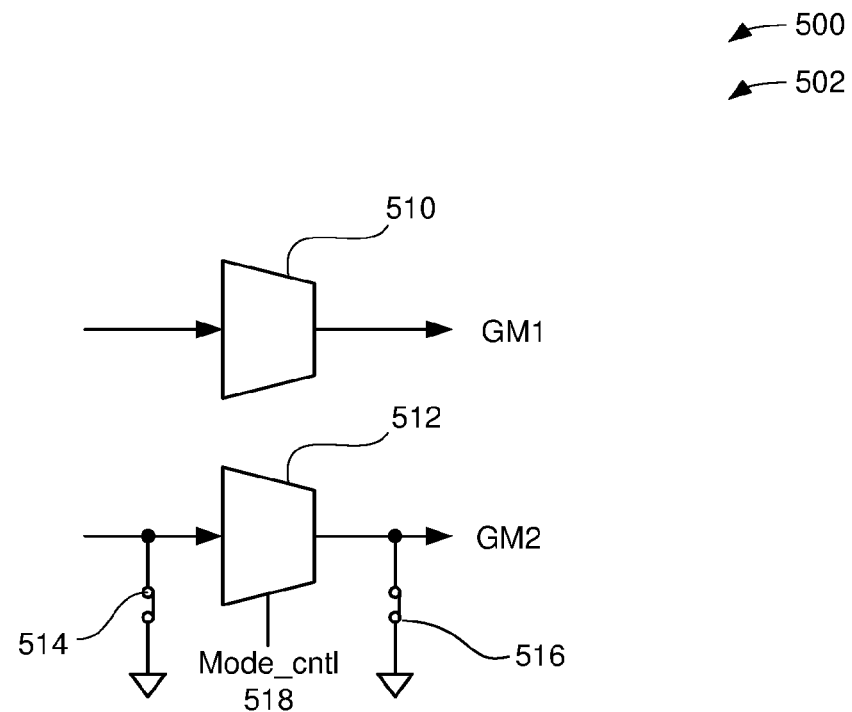
FIG. 5B is a block diagram of the transconductance amplifier of FIG. 5A configured to operate in a single-ended mode.

FIG. 5B is a block diagram 502 of the gm amplifier 500 configured to operate in a single-ended mode. In the single-ended mode, the second gm unit 512 may be disabled, and the first switch 514 and the second switch 516 may be closed. When the first switch 514 and the second switch 516 are closed, input, and output terminals associated the second gm unit 512 are grounded.

When configured to operate in the single-ended mode, the first gm unit 510 may be configured to receive a single-ended gm input signal and output a single-ended gm output signal through the first terminal GM1. The second gm unit 512 may be disabled or in a low-power state to reduce energy consumption. Table 3 illustrates various states of the first switch 514, the second switch 516, and the second gm unit 512 to when operating the gm amplifier 500 in the differential and the single-ended modes. Although only one gm amplifier embodiment is described above, persons skilled in the art will recognize that other gm amplifier implementations are possible.

TABLE 3

| Component | Differential Mode | Single-ended Mode |
| --- | --- | --- |
| Switch 514 | Open | Closed |
| Switch 516 | Open | Closed |
| GM Unit 512 | Enabled | Disabled |

Figure 6A:
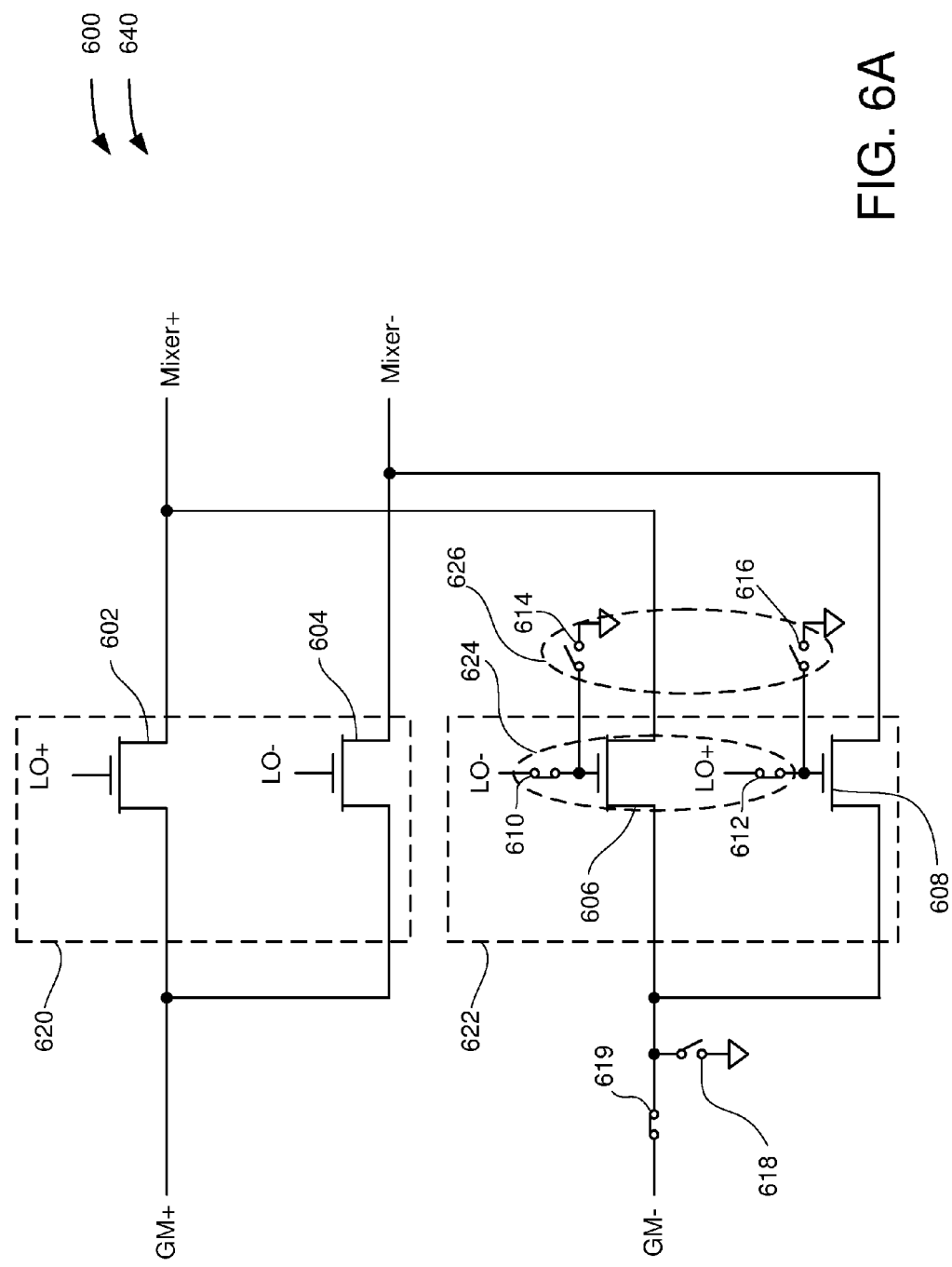
FIG. 6A is a schematic diagram of a configurable mixer configured to operate in a linear operating mode.

FIG. 6A is a schematic diagram 640 of a configurable mixer 600, configured to operate in the linear operating mode. The configurable mixer 600 may be an embodiment of the configurable mixer 206 of FIG. 2. The configurable mixer 600 may include a first transistor 602, a second transistor 604, a third transistor 606, a fourth transistor 608, a first switch 610, a second switch 612, an third switch 614, a fourth switch 616, a fifth switch 618, and a sixth switch 619. The first transistor 602 and the second transistor 604 may form a first transistor pair 620 and the third transistor 606 and the fourth transistor 608 may form a second transistor pair 622. In a similar manner, the first switch 610 and the second switch 612 may form a first set of switches 624 and the third switch 614 and the fourth switch 616 may for a second set of switches 626. In some embodiments, the first switch 610, the second switch 612, the third switch 614, the fourth switch 616, the fifth switch 618, and the sixth switch 619 may be controlled by a mode_cntl signal (not shown for simplicity). Although shown as mechanical switches, the first switch 610, the second switch 612, the third switch 614, the fourth switch 616, the fifth switch 618, and the sixth switch 619 may be any technically feasible device and/or electronic component suitable for electrically coupling together two or more terminals.

As described above with respect to FIG. 2, the configurable mixer 600 may multiply two input signals together to generate the mixer output signal 226. In some embodiments, the two input signals may include the gm amplifier output signal 224 (from, for example, the gm amplifier 204) and the LO signal 228 from a frequency synthesizer (not shown for simplicity). The LO signal 228 may be a differential signal and the gm amplifier output signal 224 may be a differential or a single-ended signal. The gm amplifier output signal 224 may be received through GM+ and GM− input terminals. The LO signals may be received through LO+ and LO− input terminals. Configurable mixer output signals (e.g., the mixer output signal 226) may be output via a first terminal Mixer+ and a second terminal Mixer−.

When configured to operate in the linear operating mode, the configurable mixer 600 may operate as a double-balanced mixer where both input signals provided to the configurable mixer 600 may be differential signals. For example, both the gm amplifier output signal 224 and the LO signal 228 may be differential signals. In the linear operating mode, the first set of switches 624 (e.g., the first switch 610 and the second switch 612) and the sixth switch 619 may be closed, while the second set of switches 626 (e.g., the third switch 614 and the fourth switch 616) and the fifth switch 618 may be open.

The switch configuration described above may configure the configurable mixer 600 to operate as a double-balanced mixer where the first transistor pair 620 and the second transistor pair 622 may multiply together the differential LO signal 228 and the differential gm amplifier output signal 224. Thus, a first signal of the differential LO signal (e.g., LO+) may be provided to a gate terminal of the first transistor 602 and a gate terminal of the fourth transistor 608. A second signal of the differential LO signal (e.g., LO−) may be provided to a gate terminal of the second transistor 604 and a gate terminal of the third transistor 606. Note that in the linear operating mode, the LO+ signal travels through the second switch 612 and the LO− signal travels through the first switch 610.

A first signal of the differential gm amplifier output signal 224 (e.g., GM+) may be provided to a drain terminal of the first transistor 602 and a drain terminal of the second transistor 604. A second signal of the differential gm amplifier output signal 224 (e.g., GM−) may be provided to a drain terminal of the third transistor 606 and a drain terminal of the fourth transistor 608. The Mixer+ terminal may be coupled to a source terminal of the first transistor 602 and a source terminal of the third transistor 606. The Mixer− terminal may be coupled to a source terminal of the second transistor 604 and a source terminal of the fourth transistor 608. Thus, in the linear operating mode, a fully differential gm amplifier output signal 224 may be multiplied by a fully differential LO signal 228 via the first transistor pair 620 and the second transistor pair 622. Those skilled in the art will recognize that connections to source and drain terminals of transistors may be swapped. Further, the first transistor 602, the second transistor 604, the third transistor 606, and the fourth transistor 608 may be formed with NMOS transistors and/or with PMOS transistors.

It is to be noted that in the linear operating mode, the configurable mixer 600 may provide relatively more linear performance (e.g., linearity) while consuming relatively more power (in comparison to the legacy and low-power operating modes described below). The linear performance may be advantageous when operating the analog front end 200 in the presence of interference or signal jammers. The linear performance may also be advantageous when the analog front end 200 is receiving Frequency Division Duplex (FDD) communication signals. The increased linearity may provide increased receiver sensitivity.

Figure 6B:
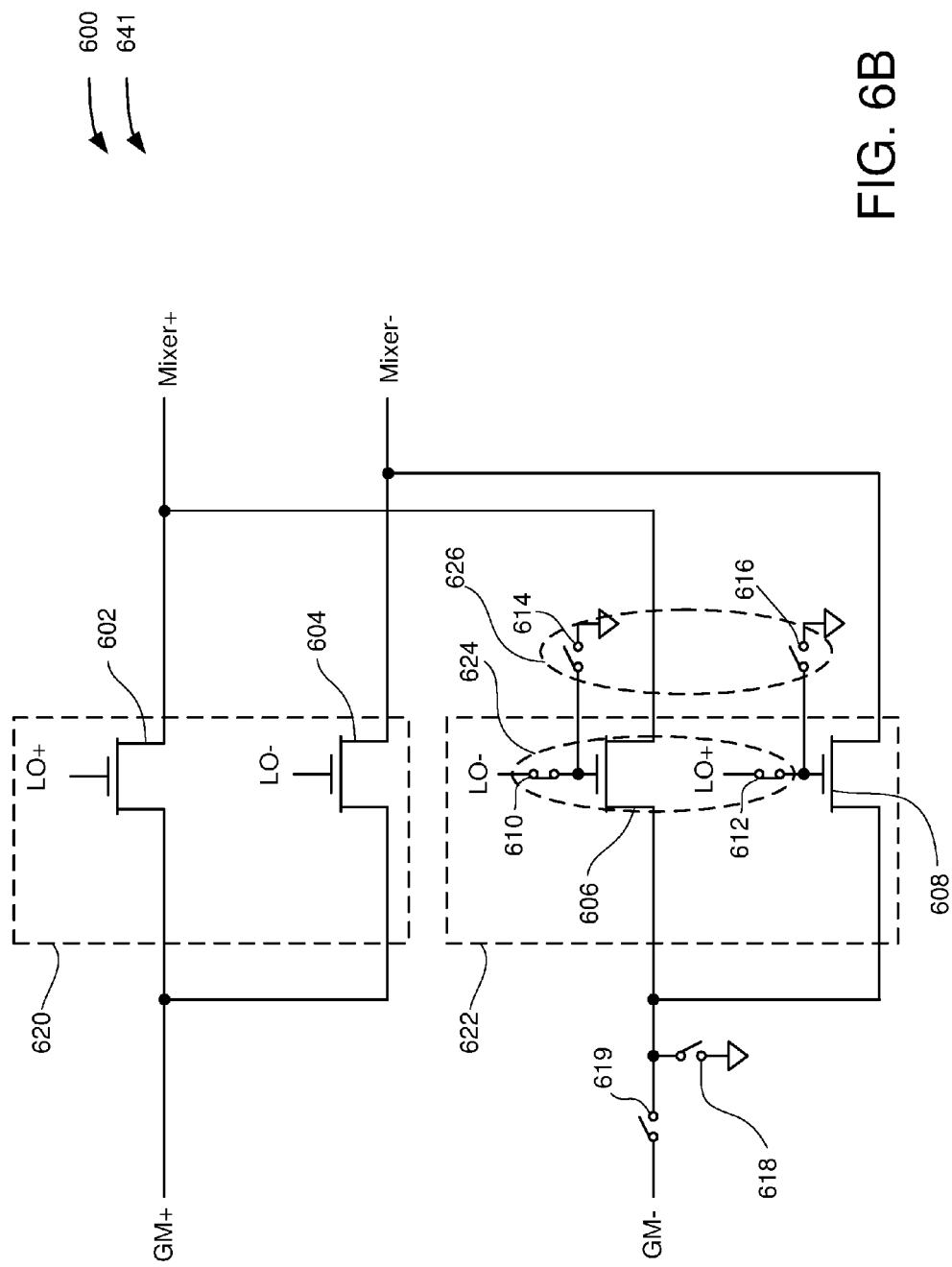
FIG. 6B is a schematic diagram of a configurable mixer configured to operate in a legacy operating mode

FIG. 6B is a schematic diagram 641 of the configurable mixer 600, configured to operate in the legacy operating mode. When configured to operate in the legacy operating mode, the configurable mixer may operate as a double-balanced mixer where one of the input signals provided to the configurable mixer 600 may be a single-ended signal while the other signal is a differential signal. For example, the LO signal 228 may be a differential signal and the gm amplifier output signal 224 may be a single-ended signal. In the legacy operating mode, the first set of switches 624 (e.g., the first switch 610 and the second switch 612) may be closed, while the second set of switches 626 (e.g., the third switch 614 and the fourth switch 616), the fifth switch 618, and the sixth switch 619 may be open.

Similar to the linear operating mode, the switch configuration described above allows the configurable mixer 600 to operate as a double-balanced mixer. However, since sixth switch 619 is open, the gm amplifier output signal is isolated from the third transistor 606 and the fourth transistor 608. In some embodiments, the GM− input terminal may be coupled to ground through a resistor (not shown for simplicity) or through fifth switch 618 when the configurable mixer 600 is configured to operate in the legacy mode.

It is to be noted that in the legacy operating mode, there may be a reduction in gain compared to operating in the linear operating mode described above. In the legacy operating mode, the LNA 202 and/or the gm amplifier 204 may be configured to provide a single-ended signal and, as a result, less gain may be provided by or through the configurable mixer 600. In some implementations, the amount of gain may step down by approximately 6 dB. Thus, in some embodiments, the configurable mixer 600 may be configured to operate in the legacy mode when a reduced amount of gain may be desired. The reduced gain may be advantageous when the analog front end 200 is receiving FDD communication signals that may require medium or low amounts of gain.

In some embodiments, an LO noise associated with the LO signal 228 may "leak" (e.g., propagate) through the first transistor pair 620 to the output of the configurable mixer 600. Although no signal is received through the GM− terminal, an output signal from the second transistor pair 622 may reduce the LO noise at the Mixer+ and Mixer− terminals of the configurable mixer 600. Output signals with reduced LO signal noise may be advantageous when the analog front end 200 is receiving communication signals that may be sensitive to LO noise.

Figure 6C:
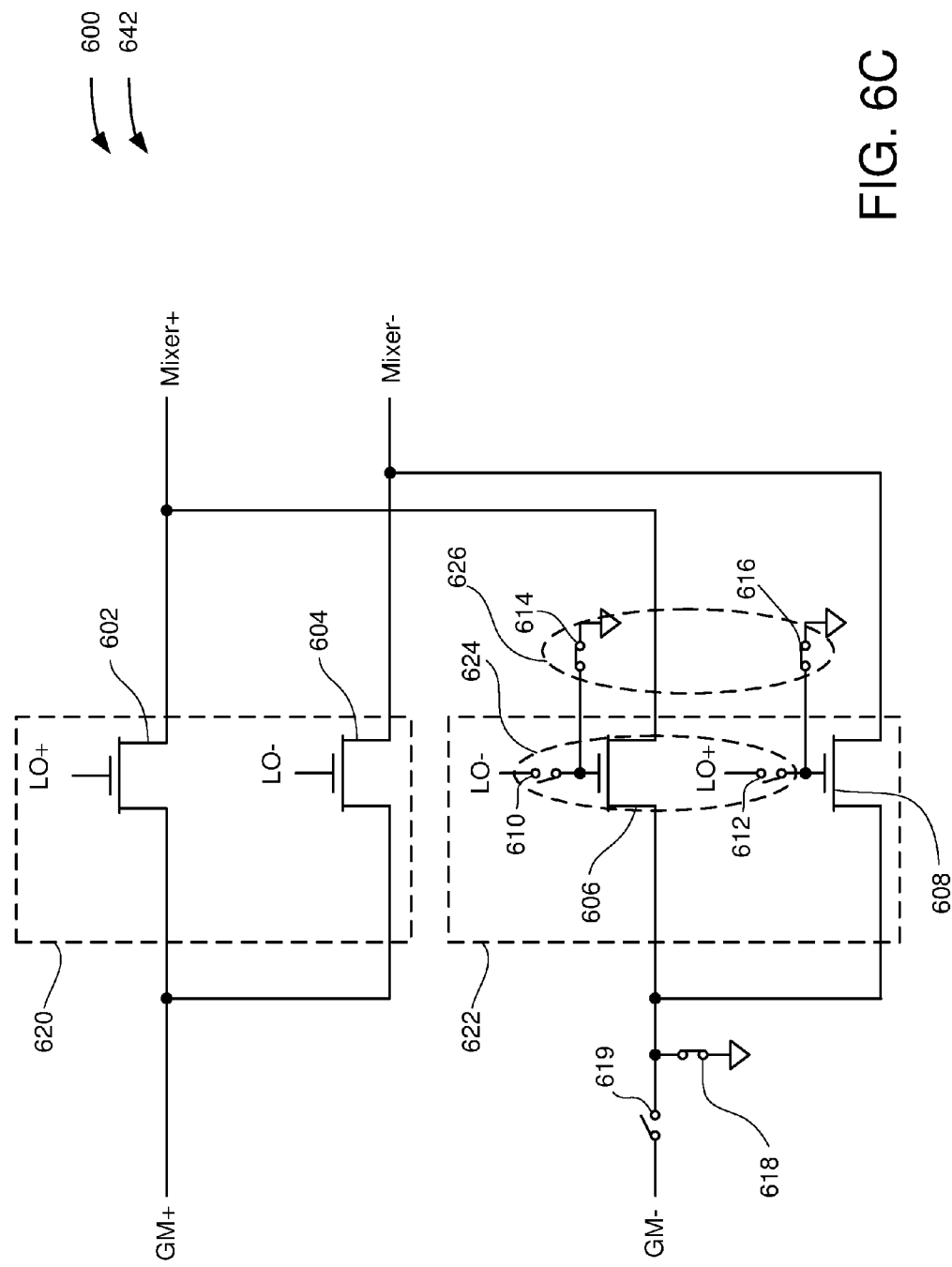
FIG. 6C is a schematic diagram of a configurable mixer configured to operate in a low-power operating mode.

FIG. 6C is a schematic diagram 642 of the configurable mixer 600, configured to operate in the low-power operating mode. When configured to operate in the low-power operating mode, the configurable mixer 600 may operate as a single-balanced mixer where one of the input signals provided to the configurable mixer 600 may be a single-ended signal while the other signal is a differential signal. In the low-power operating mode, the first set of switches 624 (e.g., the first switch 610 and the second switch 612) and the sixth switch 619 may be open, while the second set of switches 626 (e.g., the third switch 614 and the fourth switch 616), and the fifth switch 618 may be closed.

In the low-power operating mode, the second transistor pair 622 may be disabled and/or placed in a low-power state. For example, the second set of switches 626 may couple the gate terminals of the second transistor pair 622 to ground while the first set of switches 624 isolate the second transistor pair 622 from the LO signal 228. In some embodiments, coupling a gate terminal of a transistor to ground may disable or turn off the respective transistor. Thus, in the low-power operating mode, the single-ended gm amplifier output signal 224 may be multiplied by a differential LO signal 228 via the first transistor pair 620.

In some embodiments, disabling the second transistor pair 622 may reduce the linearity of the configurable mixer 600. However, by disabling the second transistor pair 622 power consumption of the configurable mixer 600 may be reduced. In some embodiments, power consumption may be reduced by approximately one-half compare to operating in the linear operating mode. Power consumption of the analog front end 200 may further be reduced by configuring the LNA 202 and the gm amplifier 204 (not shown in FIG. 6, for simplicity) to operate in the single-ended mode. Table 4 illustrates various states of the first switch 610, the second switch 612, the third switch 614, the fourth switch 616, the fifth switch 618, and the sixth switch 619 when operating the configurable mixer 600 in the linear, the legacy, and the low-power modes.

TABLE 4

| Switch | Linear mode | Legacy mode | Low-power mode |
| --- | --- | --- | --- |
| 610 | Closed | Closed | Open |
| 612 | Closed | Closed | Open |
| 614 | Open | Open | Closed |
| 616 | Open | Open | Closed |
| 618 | Open | Open | Closed |
| 619 | Closed | Open | Open |

Figure 7:
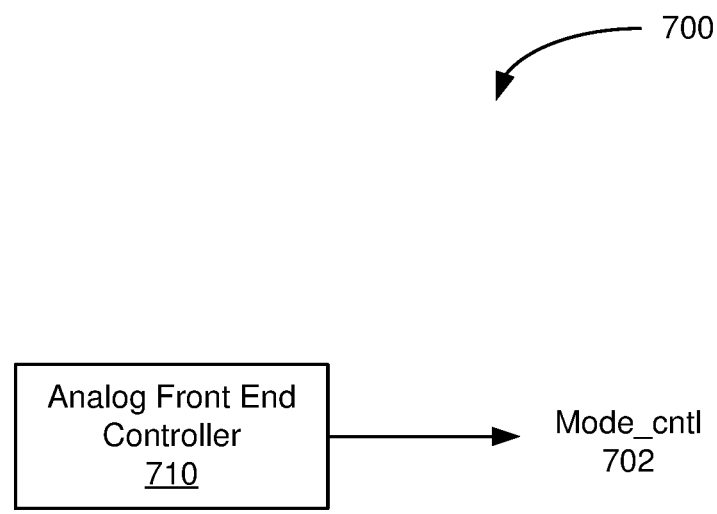
FIG. 7 is a block diagram of an exemplary mode selection module, in accordance with some embodiments.

FIG. 7 is a block diagram of an exemplary mode selection module 700, in accordance with some embodiments. Mode selection module 700 may include an analog front end controller 710. The analog front end controller 710 may generate a mode_cntl signal 702 to cause the LNA 202 and/or the gm amplifier 204 (see FIG. 2) to operate in the differential mode or the single-ended mode and the configurable mixer 206 to operate in the linear operating mode, the legacy operating mode, or the low-power operating mode. In some embodiments, the mode_cntl signal 702 may be determined based on a desired linearity of the analog front end 200. In other embodiments, the mode_cntl signal 702 may be determined based on operating conditions (e.g., RF blockers or jammers) near and/or around the wireless device 102. In still other embodiments, the mode_cntl signal 702 may be determined based on a desired power consumption or on a desired amount of gain to be provided by the LNA 202, the gm amplifier 204, and/or the configurable mixer 206.

Figure 8:
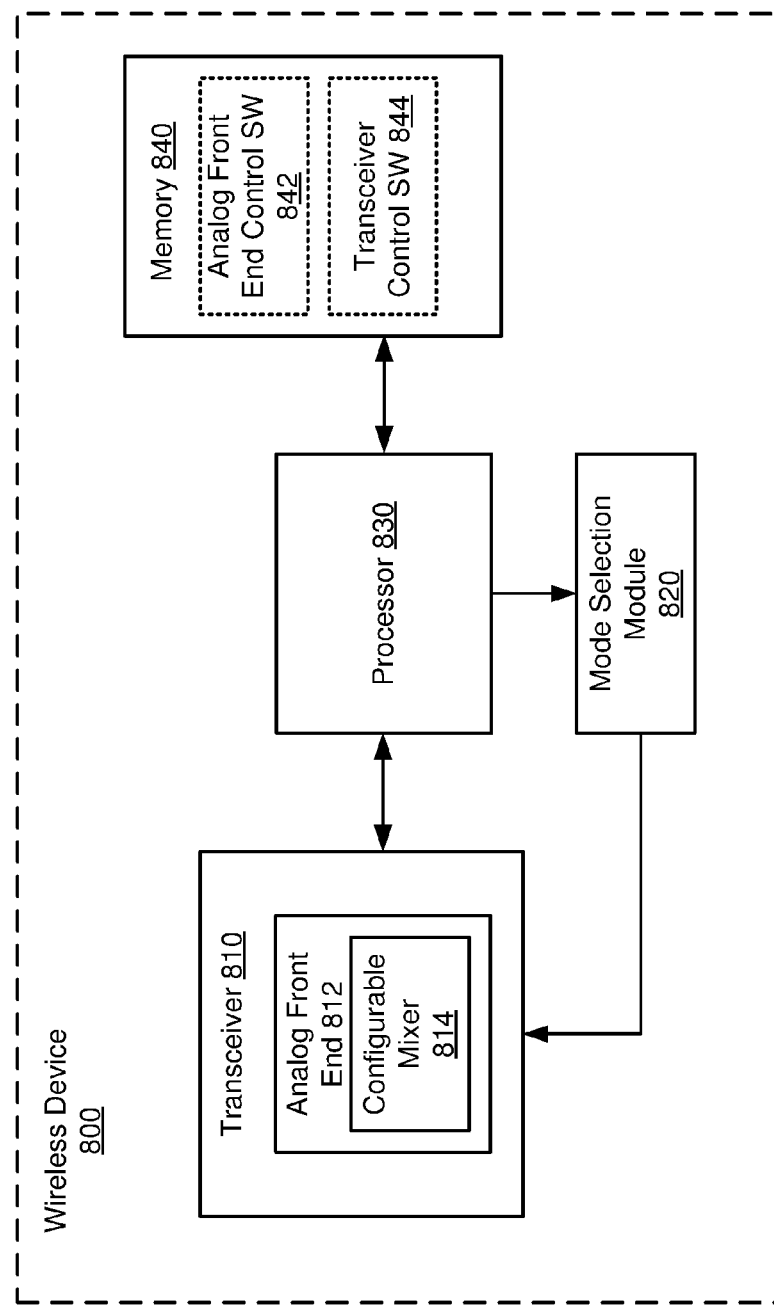
FIG. 8 depicts a wireless device that is another exemplary embodiment of the wireless device of FIG. 1.

FIG. 8 depicts a wireless device 800 that is another exemplary embodiment of the wireless device 102 of FIG. 1. Wireless device 800 may include a transceiver 810, a mode selection module 820, a processor 830, and a memory 840. Transceiver 810 may include an analog front end 812 which, in turn, may include a configurable mixer 814. The analog front end 812 may be another embodiment of the analog front end 200 of FIG. 2. The configurable mixer 814 may be another embodiment of the configurable mixer 600 of FIG. 6.

The analog front end 812 and/or the configurable mixer 814 may be configured to operate in a plurality of modes. For example, the analog front end 812 may be configured to operate in the differential mode and provide a differential gm output signal to the configurable mixer 814 or in a single-ended mode and provide a single-ended gm output signal to the configurable mixer 814. The configurable mixer 814 may be configured to operate in the linear, the legacy, or the low-power operating modes.

The mode selection module 820 may be coupled to the processor 830 and the transceiver 810. The mode selection module 820 may be an embodiment of the mode selection module 700 of FIG. 7 and may generate one or more signals to control the analog front end 812 within the transceiver 810.

Memory 840 may include a non-transitory computer-readable storage medium (e.g., one or more nonvolatile memory elements, such as EPROM, EEPROM, Flash memory, a hard drive, etc.) that may store the following software modules:
  an analog front end control software (SW) module 842 to control the analog front end 812 and the mode selection module 820; and a transceiver control SW module 844 to control signal transmission and reception through the transceiver 810. Each software module includes program instructions that, when executed by the processor 830, may cause the wireless device 800 to perform the corresponding function(s). Thus, the non-transitory computer-readable storage medium of the memory 840 may include instructions for performing all or a portion of the operations of FIG. 9.

Processor 830, which is coupled to the transceiver 810, the mode selection module 820, and the memory 840, may be any suitable processor capable of executing scripts or instructions of one or more software programs stored in the wireless device 800 (e.g., within the memory 840).

Processor 830 may execute analog front end control SW module 842 to control the analog front end 812 and the mode selection module 820. For example, the execution of the analog front end control SW module 842 may cause the mode selection module 820 to generate one or more signals, such as a mode_cntl signal, in accordance with a desired operating mode. The mode_cntl signal may determine the operating mode of the analog front end 812 and/or the configurable mixer 814.

Processor 830 may execute the transceiver control SW module 844 to cause transceiver 810 to transmit and/or receive an RF signal. In some embodiments, execution of the transceiver control SW module 844 may cause the transceiver 810 to transmit and/or receive communication signals in specific channels and/or frequencies.

Figure 9:
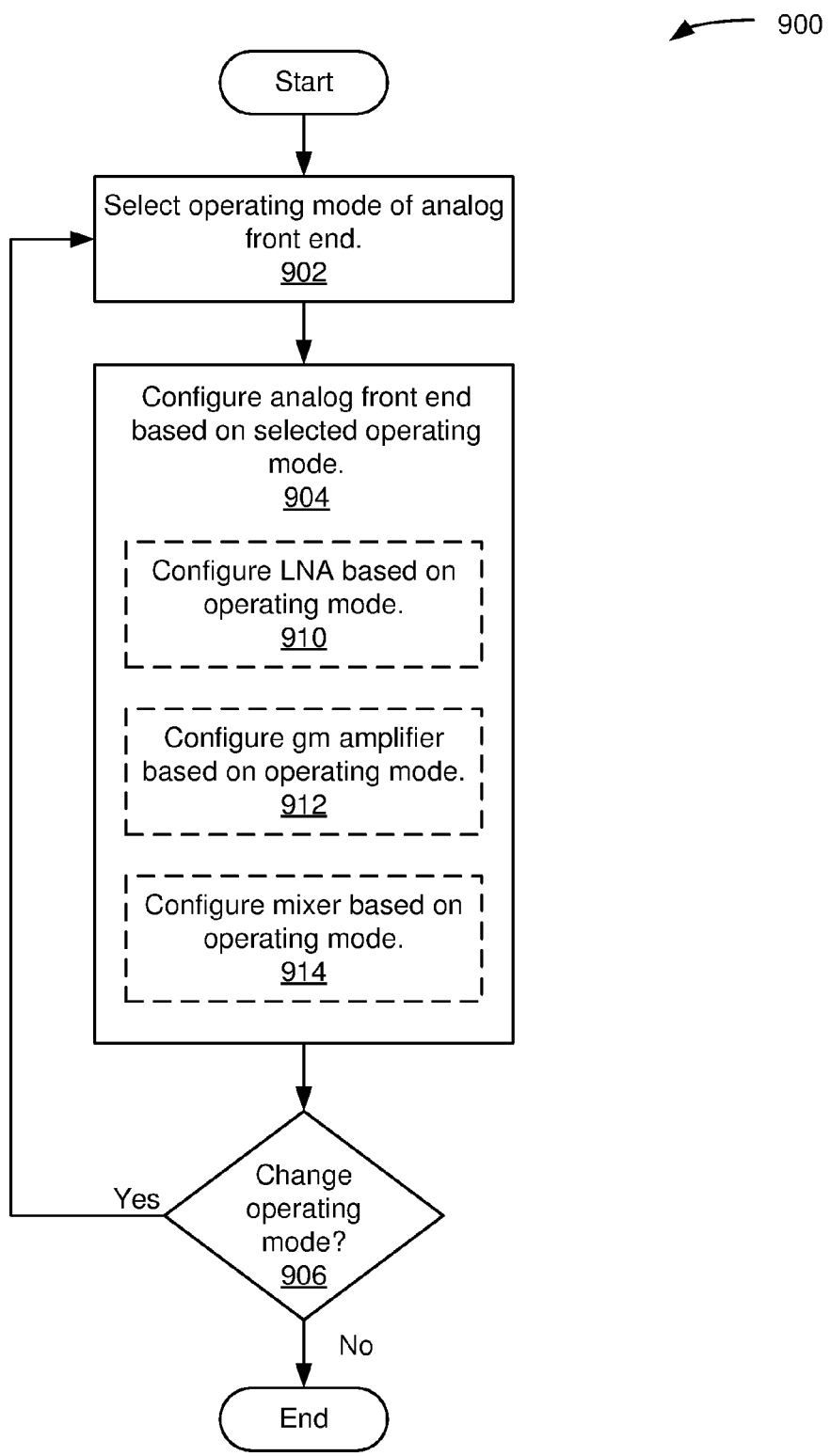
FIG. 9 shows an illustrative flow chart depicting an exemplary operation for operating an analog front end, in accordance with some embodiments.

FIG. 9 shows an illustrative flow chart depicting an exemplary operation 900 for operating an analog front end, in accordance with some embodiments. Referring also to FIG. 2, the operating mode of the analog front end 200 is selected (902). In some embodiments, the operating mode may be determined based on operating conditions of the wireless device 102 (see FIG. 1), a desired linearity or other performance metric associated with the wireless device, or the like. For example, if RF blockers or signal jammers are detected or anticipated, then the analog front end 200 may be configured to operate in a differential mode and the configurable mixer 206 may be configured to operate in a linear mode. In another example, if conserving battery life is a priority, then the analog front end 200 may be configured to operate in a single-ended mode and the configurable mixer 206 may be configured to operate in a low-power mode. In still another example, if a reduced amount of gain is desired, then the configurable mixer 206 may be configured to operate in the legacy operating mode or the low-power operating mode.

Next, the analog front end 200 is configured based, at least in part, on the selected operating mode of the analog front end 200 (904). In some embodiments, a mode_cntl signal may be driven in accordance with the selected operating mode. In some embodiments, configuration of the analog front end 200 may include one or more optional operations to configure one or more components within the analog front end 200. Some optional operations are described below and are illustrated in FIG. 9 with dashed lines.

In some embodiments, the LNA 202 may be configured based on the selected operating mode of the analog front end 200 (910). For example, the LNA 202 may be configured to operate in the differential mode or the single-ended mode in accordance with the selected operating mode of the analog front end 200.

In some embodiments, the gm amplifier 204 may be configured based on the selected operating mode of the analog front end 200 (912). For example, the gm amplifier 204 may be configured to operate in the differential mode or the single-ended mode in accordance with the selected operating mode of the analog front end 200.

In some embodiments, the configurable mixer 206 may be configured to operate based, at least in part, on the selected operating mode of the analog front end 200 (914). For example, the configurable mixer 206 may be configured to operate in the linear mode, the legacy mode, or the low-power mode in accordance with the selected operating mode of the analog front end 200.

In some embodiments, in the linear operating mode the first transistor pair 620 and the second transistor pair 622 (see FIG. 6) of the configurable mixer 600 may be configured to multiply a first differential signal by a second differential signal. The first set of switches 624 may be configured to provide at least part of the second differential signal to gate terminals of the second pair of transistors. In the legacy operating mode, the sixth switch 619 may isolate at least part of the gm amplifier output signal from the second transistor pair 622. In the low-power mode, the second transistor pair 622 may be disabled. The first set of switches 624 may isolate the gate terminals of the second transistor pair 622 from the first differential signal. The second set of switches 626 may couple gate terminals of the second transistor pair 622 to ground. The first transistor pair 620 may multiply the first differential signal by a single-ended signal (e.g., a portion of the second differential signal).

In some embodiments, the configuration of the LNA 202, the gm amplifier 204, and the configurable mixer 206 may be determined, at least in part, by the mode_cntl signal. For example, the mode_cntl signal 250 may be provided to the LNA 202, the gm amplifier 204 and the configurable mixer 206. Within the configurable mixer 206, the mode_cntl signal 250 may configure one or more switches (e.g., the first switch 610, the second switch 612, the third switch 614, the fourth switch 616, the fifth switch 618, and the sixth switch 619).

Next, a change of operating mode of the analog front end 200 is determined (906). If the operating mode of the analog front end 200 is changing, then the operation returns to 902. On the other hand, if the operating mode of the analog front end 200 is not changing, the operation ends.

In the foregoing specification, the example embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A configurable mixer comprising:
   a first transistor pair configured to multiply a first signal by a first differential signal;
   a second transistor pair configured to multiply a second signal by the first differential signal; and
   a first set of switches configured to selectively couple respective gate terminals of the second transistor pair to a ground potential based, at least in part, on an operating mode of the configurable mixer.

2. The configurable mixer of claim 1, further comprising:
   a second set of switches configured to selectively provide the first differential signal to the gate terminals of the second transistor pair based, at least in part, on the operating mode of the configurable mixer.

3. The configurable mixer of claim 2, further comprising:
a switch configured to selectively couple at least one of a drain terminal, or a source terminal or a combination thereof, of each transistor in the second transistor pair to the ground potential.

4. The configurable mixer of claim 3, wherein an operation of the switch is based, at least in part, on the operating mode of the configurable mixer.

5. The configurable mixer of claim 2, further comprising:
a switch configured to selectively couple at least one of a drain terminal, or a source terminal, or a combination thereof, of each transistor in the second transistor pair to the second signal.

6. The configurable mixer of claim 5, wherein the configurable mixer operates as a double-balanced mixer and the second signal is isolated from the configurable mixer.

7. The configurable mixer of claim 2, wherein the configurable mixer operates as a single-balanced mixer when configured in a first operating mode, and operates as a double-balanced mixer when configured in a second operating mode.

8. The configurable mixer of claim 7, wherein the first set of switches are closed and the second set of switches are open when configured in the first operating mode, and the first set of switches are open and the second set of switches are closed when configured in the second operating mode.

9. The configurable mixer of claim 1, wherein the first differential signal is a differential local oscillator (LO) signal.

10. The configurable mixer of claim 1, wherein the configurable mixer is included in an analog front end.

11. The configurable mixer of claim 10, wherein the analog front end comprises a low noise amplifier (LNA), and a transconductance amplifier configured to receive an LNA output signal from the LNA, wherein the first signal comprises a first signal from the transconductance amplifier and the second signal comprises a second signal from the transconductance amplifier.

12. The configurable mixer of claim 10, wherein the analog front end further comprises a controller to generate a mode control signal in accordance with the operating mode.

13. The configurable mixer of claim 12, wherein the first set of switches operate in response to the mode control signal.

14. A method of operating an analog front end comprising a configurable mixer, the method comprising:
selecting an operating mode of the analog front end;
multiplying, by a first transistor pair, a first signal by a first differential signal; and
selectively activating a first set of switches coupled to gate terminals of a second transistor pair based, at least in part, on the selected operating mode.

15. The method of claim 14, wherein the selectively activating the first set of switches comprises:
closing the first set of switches to couple the gate terminals of the second transistor pair to a ground potential when a first operating mode is selected.

16. The method of claim 15, wherein the selectively activating the first set of switches comprises:
opening the first set of switches to decouple the gate terminals of the second transistor pair from the ground potential when a second operating mode is selected.

17. The method of claim 14, further comprising:
selectively activating a second set of switches coupled to the gate terminals of the second transistor pair based, at least in part, on the selected operating mode.

18. The method of claim 17, wherein the selectively activating the second set of switches comprises:
opening the second set of switches to isolate the first differential signal from the gate terminals of the second transistor pair when a first operating mode is selected.

19. The method of claim 18, wherein the selectively activating the second set of switches comprises:
closing the second set of switches to provide the first differential signal to the gate terminals of the second transistor pair when a second operating mode is selected.

20. The method of claim 14, further comprising:
multiplying, by the second transistor pair, a second signal by the first differential signal.

21. The method of claim 14, further comprising:
coupling at least one of a drain terminal, or a source terminal, or a combination thereof, of each transistor in the second transistor pair to a ground potential based, at least in part, on the operating mode.

22. A configurable mixer comprising:
means for multiplying a first signal by a first differential signal via a first transistor pair; and
means for multiplying a second signal by the first differential signal via a second transistor pair; and
means for selectively activating a first set of switches to couple gate terminals of the second transistor pair to a ground potential based, at least in part, on an operating mode of the configurable mixer.

23. The configurable mixer of claim 22, wherein the means for multiplying the second signal is to:
close the first set of switches to couple the gate terminals of the second transistor pair to the ground potential when operating in a first operating mode; and
open the first set of switches to decouple the gate terminals of the second transistor pair from the ground potential when operating in a second operating mode.

24. The configurable mixer of claim 22, wherein the means for multiplying the second signal is to:
selectively activate a second set of switches to provide the first differential signal to the gate terminals of the second transistor pair, based, at least in part, on an operating mode of the configurable mixer.

25. The configurable mixer of claim 24, wherein the means for multiplying the second signal is to:
open the second set of switches to isolate the first differential signal from the gate terminals of the second transistor pair when operating in a first operating mode; and
close the second set of switches to provide the first differential signal to the gate terminals of the second transistor pair when operating in a second operating mode.

26. The configurable mixer of claim 22, wherein the first signal and the second signal form a second differential signal distinct from the first differential signal.

* * * * *